United States Patent
Takehana et al.

(10) Patent No.: US 7,170,134 B2
(45) Date of Patent: Jan. 30, 2007

(54) SEMICONDUCTOR DEVICE

(75) Inventors: Yasuhiro Takehana, Otsu (JP); Toshihiko Uno, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 297 days.

(21) Appl. No.: 10/994,358

(22) Filed: Nov. 23, 2004

(65) Prior Publication Data

US 2005/0127450 A1 Jun. 16, 2005

(30) Foreign Application Priority Data

Dec. 12, 2003 (JP) ............................. 2003-415263

(51) Int. Cl.
*H01L 29/76* (2006.01)
*H01L 29/94* (2006.01)

(52) U.S. Cl. ...................... 257/343; 257/492; 438/527

(58) Field of Classification Search ............... 257/343, 257/492–493; 438/514, 527, 549
See application file for complete search history.

(56) References Cited

U.S. PATENT DOCUMENTS

| 6,010,926 | A  * | 1/2000 | Rho et al. ................ 438/199 |
| 6,424,007 | B1 * | 7/2002 | Disney .................... 257/342 |
| 2002/0119611 | A1 | 8/2002 | Disney | |

FOREIGN PATENT DOCUMENTS

JP 2002-43562 2/2002

* cited by examiner

*Primary Examiner*—Theresa T. Doan
(74) *Attorney, Agent, or Firm*—McDermott Will & Emery LLP

(57) ABSTRACT

P-type buried regions 104a and 104b are formed in an extended drain region 102 formed in a P-type semiconductor substrate 110. An N-type buried region 113 is formed between the P-type buried regions 104a and 104b. An N-type impurity concentration of the N-type buried region 113 along a G–G' plane is low in the vicinity of boundaries between the N-type buried region 113 and the P-type buried regions 104a and 104b and is increased from the boundaries to an inside of the N-type buried region 113.

6 Claims, 6 Drawing Sheets

SEMICONDUCTOR DEVICE

BACKGROUND OF THE INVENTION

1. Field of the Invention

The present invention relates to a semiconductor device. More particularly, the present invention relates to a lateral semiconductor device (lateral transistor) having a low on-resistance and a high withstand voltage.

2. Description of the Background Art

Conventionally, various MOS transistors (lateral semiconductor devices), which have a further reduced level of on-resistance while maintaining a high withstand voltage, have been proposed. For example, Japanese Laid-Open Patent Publication No. 2002-43562 discloses an example of a conventional MOS transistor.

FIG. 8 is a cross-sectional view of an example of a conventional MOS transistor 800 (hereinafter referred to as a semiconductor device 800). The semiconductor device 800 comprises a P-type semiconductor substrate 810, a source electrode 807, a drain electrode 805, a gate insulating film 814, a gate electrode 809, and an insulating film 812. In the P-type semiconductor substrate 810, an N-type extended drain region 802, an N-type high-concentration drain region 803, P-type buried regions 804a and 804b, an antipunch through region 808, an N-type source region 801, and a P-type substrate contact region 806 are formed.

In the P-type semiconductor substrate 810, the N-type source region 801 and the P-type substrate contact region 806 are formed adjacent to each other. Upper surfaces of the N-type source region 801 and the P-type substrate contact region 806 are in contact with an lower surface of the source electrode 807 in the vicinity of a boundary between the N-type source region 801 and the P-type substrate contact region 806. The antipunch through region 808 has a higher P-type impurity concentration than that of the P-type semiconductor substrate 810, and is formed surrounding the N-type source region 801 and the P-type substrate contact region 806.

The N-type high-concentration drain region 803 is formed in the extended drain region 802. An upper surface of the N-type high-concentration drain region 803 is connected to a lower surface of the drain electrode 805. The N-type high-concentration drain region 803 has a higher N-type impurity concentration than that of the extended drain region 802. A region of an upper surface of the P-type semiconductor substrate 810, on which the source electrode 807 and the drain electrode 805 are not formed, is covered with the gate insulating film 814 and the insulating film 812.

The gate electrode 809 is formed over a region of the P-type semiconductor substrate 810 between the extended drain region 802 and the antipunch through region 808 via the gate insulating film 814. When a predetermined amount of voltage is applied to the gate electrode 809, a channel region 811 appears at the surface of the semiconductor substrate 810 between the antipunch through region 808 and the extended drain region 802.

The P-type buried regions 804a and 804b formed in the extended drain region 802 are connected to the P-type semiconductor substrate 810 in a cross section which is not shown in FIG. 8. Therefore, the P-type buried regions 804a and 804b have the same reference potential as that of the P-type semiconductor substrate 810.

When a high voltage is applied to the drain electrode 805 and the predetermined amount of gate voltage is not applied to the gate electrode 809 (off time), the P-type semiconductor substrate 810 and the extended drain region 802 are reversely biased, and the P-type buried region 804a and 804b and the extended drain region 802 are reversely biased. A depletion layer occurs at a boundary between these regions. The occurrence of such a depletion layer during the off time enables the semiconductor device 800 to withstand a high voltage.

When a high voltage is applied to the drain electrode 805 and the predetermined gate voltage is applied to the gate electrode 809 (on-time), a current flows from the drain electrode 805 via the N-type high-concentration drain region 803, the extended drain region 802, the channel region 811, the antipunch through region 808 and the N-type source region 801 to the source electrode 807. In the extended drain region 802, as indicated with a dashed line arrow in FIG. 8, currents flow over the P-type buried region 804a, between the P-type buried regions 804a and 804b, and below the P-type buried region 804b.

The resistance value of the extended drain region 802 can be represented by the combined resistance of a parallel connection of current paths located over the P-type buried region 804a, between the P-type buried regions 804a and 804b, and below the P-type buried region 804b. As the N-type impurity concentration of the extended drain region 802 is increased, the resistance value of the extended drain region 802 is decreased, leading to a decrease in on-resistance between the source electrode 807 and the drain electrode 805.

As described above, larger depletion layers occur when the P-type buried regions 804a and 804b are provided than when the P-type buried regions 804a and 804b are not provided. Therefore, in the semiconductor device 800, a withstand voltage can be maintained high at a higher N-type impurity concentration of the extended drain region 802 than when the P-type buried regions 804a and 804b are not formed. Therefore, in the semiconductor device 800, the on-resistance can be reduced as compared to semiconductor devices without any P-type buried region.

However, the degree of the low on-resistance of the conventional semiconductor device 800 is limited due to the following reasons. The extended drain region 802 is formed by implantation and thermal diffusion of N-type impurity ions from a surface of the P-type semiconductor substrate 810. Therefore, the N-type impurity concentration of the extended drain region 802 may be a desired concentration in the vicinity of the surface thereof but decreases with an increase in depth. Therefore, the on-resistance of an actually manufactured semiconductor device is high compared to an ideal semiconductor device, in which the entire extended drain region 802 has a uniform N-type impurity concentration which is equal to an N-type impurity concentration at an upper portion thereof. When the N-type impurity concentration is increased in the entire extended drain region 802 by increasing the amount of implanted N-type impurity in order to reduce the on-resistance, the width of a depletion layer occurring during the off time is narrowed, so that a high withstand voltage cannot be maintained. Therefore, in the semiconductor device 800, the N-type impurity concentration can be increased only up to an extent which can maintain a withstand voltage, so that the degree of the low on-resistance is limited.

SUMMARY OF THE INVENTION

Therefore, an object of the present invention is to provide a lateral semiconductor device which has a further reduced on-resistance while maintaining a high withstand voltage.

The present invention has the following features to attain the object mentioned above.

A first aspect of the present invention is directed to a lateral semiconductor device, which comprises a first conductivity type semiconductor substrate, a second conductivity type source region formed in the semiconductor substrate, a second conductivity type extended drain region formed in the semiconductor substrate, a gate electrode formed over the semiconductor substrate between the source region and the drain region, a drain region formed in the extended drain region and having a second conductivity type impurity concentration higher than that of the extended drain region, at least two first conductivity type buried regions formed in the extended drain region at different depths from a surface of the extended drain region, and a second conductivity type buried region formed between the first conductivity type buried regions. A second conductivity type impurity concentration at an inside of the second conductivity type buried region is higher than a second conductivity type impurity concentration at boundaries between the first conductivity type buried regions and the second conductivity type buried region.

In a second aspect based on the first aspect, a highest second conductivity type impurity concentration of the second conductivity type buried region formed at a most shallow position from the surface of the extended drain region is higher than a second conductivity type impurity concentration at the surface of the extended drain region.

In a third aspect based on the first aspect, the first conductivity type buried region is formed by ion implantation.

In a fourth aspect based on the first aspect, the second conductivity type buried region is formed by ion implantation.

In a fifth aspect based on the first aspect, the second conductivity type buried region is electrically connected to the semiconductor substrate.

In a sixth aspect based on the first aspect, the first conductivity type buried region and the second conductivity type buried region have substantially the same planar shape.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
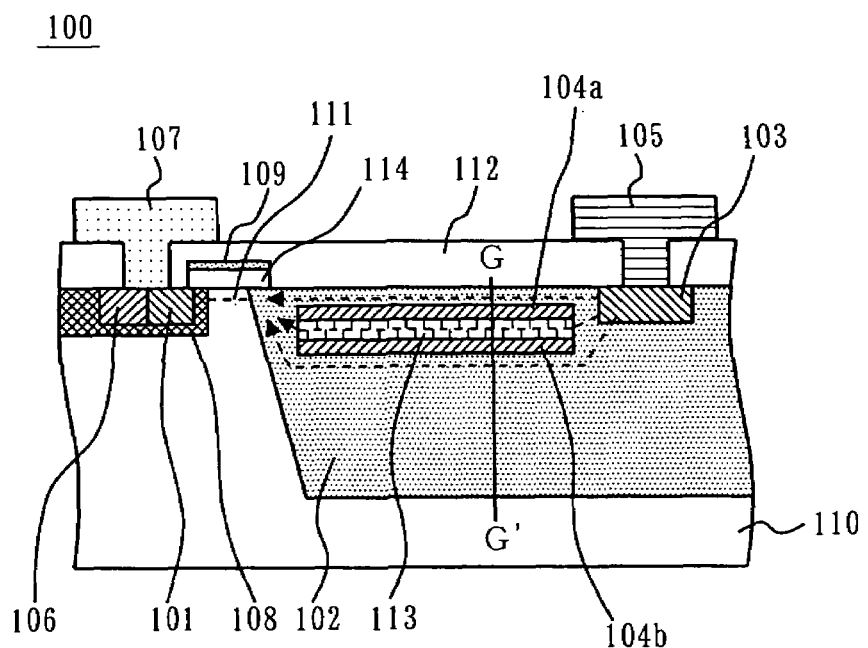
FIG. 1 is a cross-sectional view of a semiconductor device according to the present invention.

FIG. 1 is a cross-sectional view showing a MOS transistor 100 (hereinafter referred to as a semiconductor device 100), which is a lateral semiconductor device according to the present invention. The semiconductor device 100 of FIG. 1 comprises a P-type semiconductor substrate 110, a source electrode 107, a drain electrode 105, agate insulating film 114, a gate electrode 109, and an insulating film 112. In the P-type semiconductor substrate 110, an extended drain region 102, an N-type high-concentration drain region 103, P-type buried regions 104a and 104b, an N-type buried region 113, an antipunch through region 108, an N-type source region 101, and a P-type substrate contact region 106 are formed. The N-type high-concentration drain region 103, the P-type buried regions 104a and 104b, and the N-type buried region 113 are formed in the extended drain region 102.

The P-type semiconductor substrate 110 has a P-type impurity concentration of about $1\times10^{14}$ to about $3\times10^{14}$ cm$^{-3}$. The extended drain region 102 is formed at a depth of 3 to 15 μm from a surface of the P-type semiconductor substrate 110. The extended drain region 102 has an N-type impurity concentration of about $1\times10^{15}$ to about $7\times10^{16}$ cm$^{-3}$.

The P-type buried regions 104a and 104b having a thickness of about 1 to 2 μm are formed at a depth of 1 to 10 μm from the surface of the P-type semiconductor substrate 110. The P-type buried region 104b is formed deeper than the P-type buried region 104a. The P-type buried regions 104a and 104b has a P-type impurity concentration of about $1\times10^{16}$ to about $1\times10^{17}$ cm$^{-3}$.

The N-type buried region 113 is formed between the P-type buried regions 104a and 104b. The N-type buried region 113 has an N-type impurity concentration of about $2\times10^{15}$ to about $1\times10^{18}$ cm$^{-3}$. The N-type impurity concentration of the N-type buried region 113 is increased toward an inside thereof from boundaries between the N-type buried region 113 and the P-type buried regions 104a and 104b, the detail of which will be described elsewhere below. A highest N-type impurity concentration of the N-type buried region 113 is higher than a highest P-type impurity concentration of the P-type buried regions 104a and 104b.

In the P-type semiconductor substrate 110, the N-type source region 101 and the P-type substrate contact region 106 are formed adjacent to each other. Upper surfaces of the N-type source region 101 and the P-type substrate contact region 106 are in contact with an lower surface of the source electrode 107 in the vicinity of a boundary between the N-type source region 101 and the P-type substrate contact region 106. The antipunch through region 108 has a higher P-type impurity concentration than that of the P-type semiconductor substrate 110, and is formed surrounding the N-type source region 101 and the P-type substrate contact region 106.

The N-type high-concentration drain region 103 is formed in the extended drain region 102. The N-type high-concentration drain region 103 is electrically connected to the drain electrode 105 by an upper surface of the drain region 103 being in contact with a lower surface of the drain electrode 105. An N-type impurity concentration of the N-type high-concentration drain region 103 is higher than the N-type impurity concentration of the extended drain region 102. A region of the surface of P-type semiconductor substrate 110, on which the source electrode 107 and the drain electrode 105 are not formed, is covered with the gate insulating film 114 and the insulating film 112.

The gate electrode 109 is formed over a region of the P-type semiconductor substrate 110 between the extended drain region 102 and the antipunch through region 108 via the gate insulating film 114. When a predetermined amount of voltage is applied to the gate electrode 109, a channel region 111 appears on the surface of the semiconductor substrate 110 between the antipunch through region 108 and the extended drain region 102.

Figure 2:
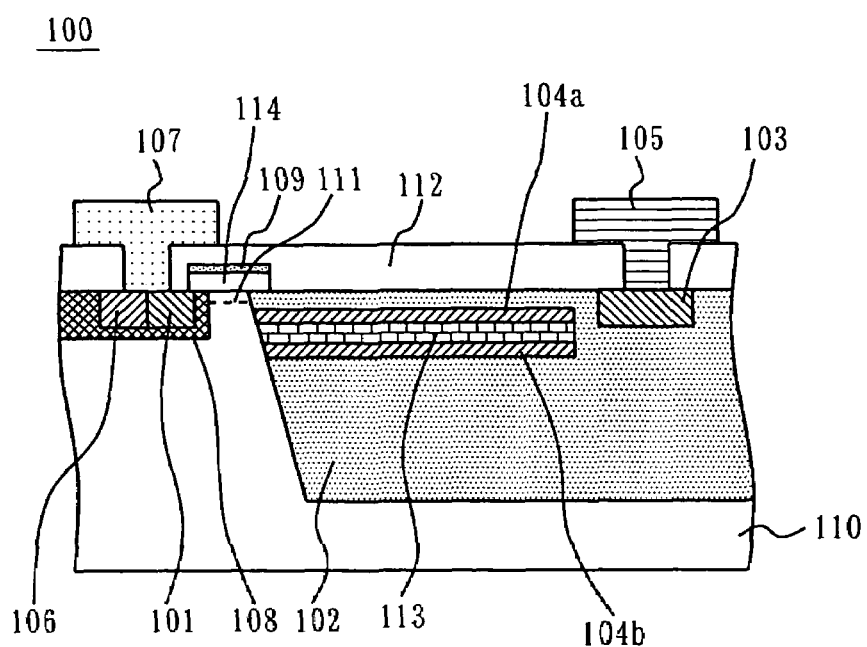
FIG. 2 is another cross-sectional view of the semiconductor device of FIG. 1.

FIG. 2 is a cross-sectional view of the semiconductor device 100 in a cross section different from that of FIG. 1. As shown in FIG. 2, a portion of a side of each of the P-type buried regions 104a and 104b is in contact with the P-type semiconductor substrate 110. Thus, the P-type buried regions 104a and 104b are electrically connected to the P-type semiconductor substrate 110, thereby having the same reference potential as that of the P-type semiconductor substrate 110. It should be noted that the reason why the N-type buried region 113 also extends to the P-type semiconductor substrate 110 in FIG. 2 is that the P-type buried regions 104a and 104b and the N-type buried region 113 are formed using the same resist pattern.

When a high voltage is applied to the drain electrode 105 and the predetermined amount of gate voltage is not applied to the gate electrode 109 (off time), the P-type semiconductor substrate 110 and the extended drain region 102 are reversely biased and the P-type buried regions 104a and 104b and the extended drain region 102 are reversely biased. A depletion layer occurs at boundaries (junction portions) between these regions. During the off time, the N-type buried region 113 is completely depleted due to a depletion layer occurring at a boundary between the N-type buried region 113 and the P-type buried region 104a and a depletion layer occurring at a boundary between the N-type buried region 113 and the P-type buried region 104b. No current flows in depletion layers. Therefore, the occurrence of the depletion layers enables the semiconductor device 100 to have a high withstand voltage.

When a high voltage is applied to the drain electrode 105 and the predetermined gate voltage is applied to the gate electrode 109 (on-time), a current flows from the drain electrode 105 via the N-type high-concentration drain region 103, the extended drain region 102, the channel region 111, the antipunch through region 108 and the N-type source region 101 to the source electrode 107. In the extended drain region 102, as indicated with a dashed line arrow in FIG. 1, currents flow over the P-type buried region 104a, through the N-type buried region 113, and below the P-type buried region 104b.

A resistance value of the extended drain region 102 can be represented by a combined resistance of a parallel connection of current paths located over the P-type buried region 104a, through the N-type buried region 113, and below the P-type buried region 104b.

Figure 3A:
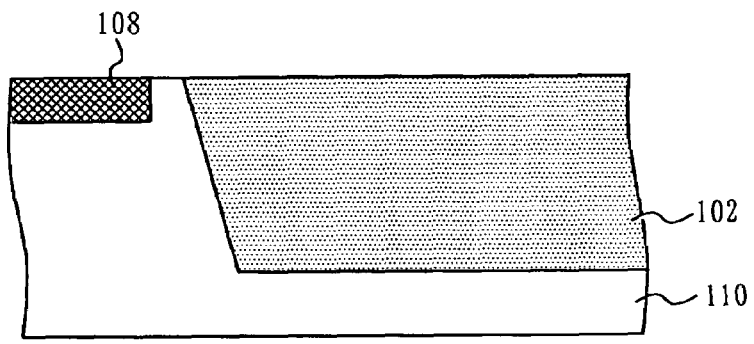
FIGS. 3A to 3C are diagram for explaining a method for fabricating the semiconductor device of FIG. 1.

Next, an exemplary method for fabricating a semiconductor device according to the present invention will be described with reference to FIGS. 3A to 3C. As shown in FIG. 3A, phosphor ions are implanted into the P-type semiconductor substrate 110 at an accelerating energy of 150 keV with a dose of $9.5 \times 10^{12}$ $cm^{-2}$. Thereafter, a thermal treatment is performed at 1200° C. for 700 minutes to thermally diffuse the implanted ions. As a result, the extended drain region 102 having a depth of 9 μm is formed. In addition, boron ions are implanted at about several hundreds of keV to form the antipunch through region 108.

Figure 3B:
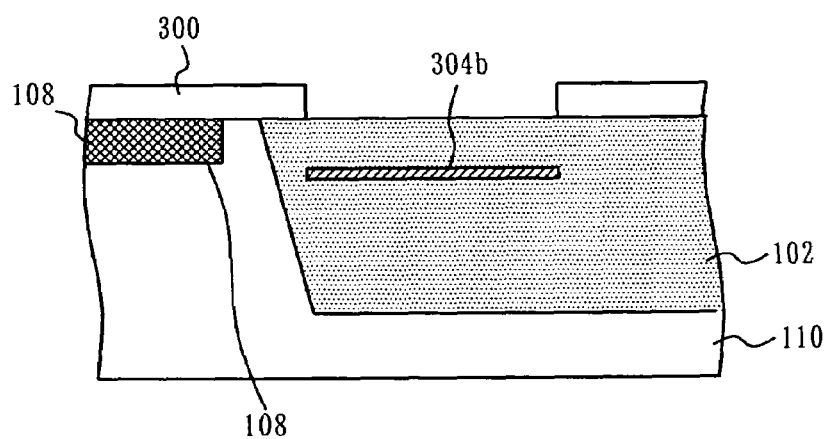
Figure 3C:
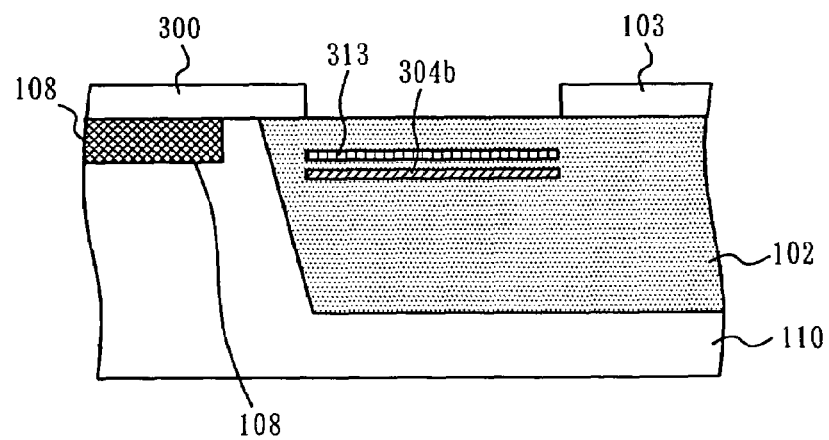
Figure 4A:
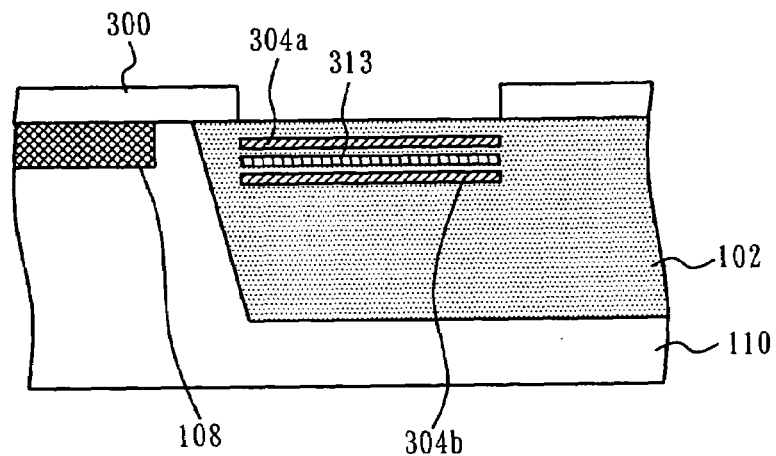
FIGS. 4A to 4C are diagrams following to FIG. 3C.

Next, as shown in FIG. 3B, a resist pattern 300 is formed on the surface of the P-type semiconductor substrate 110, followed by boron ion implantation at an accelerating energy of 2.5 MeV with a dose of $4.4 \times 10^{12}$ $cm^{-2}$. As a result, a P-type ion implantation layer 304b is formed. Thereafter, as shown in FIG. 3C, phosphor ions are implanted at an accelerating energy of 3 MeV with a dose of $8.0 \times 10^{12}$ $cm^{-2}$ to form an N-type ion implantation layer 313. The accelerating energy is selected so that the N-type ion implantation layer 313 is formed at a position where the highest N-type impurity concentration of the N-type buried region 113 is desired. Further, as shown in FIG. 4A, boron ions are implanted at an accelerating energy of 750 keV with a dose of $3.7 \times 10^{12}$ $cm^{-2}$ to form a P-type ion implantation layer 304a.

Next, the resist pattern 300 is removed. Thereafter, a thermal treatment is performed at 1000° C. for 20 minutes so that the ions are diffused from the P-type ion implantation layers 304a and 304b and the N-type ion implantation layer 313 to form the P-type buried regions 104a and 104b and the N-type buried region 113.

Figure 4B:
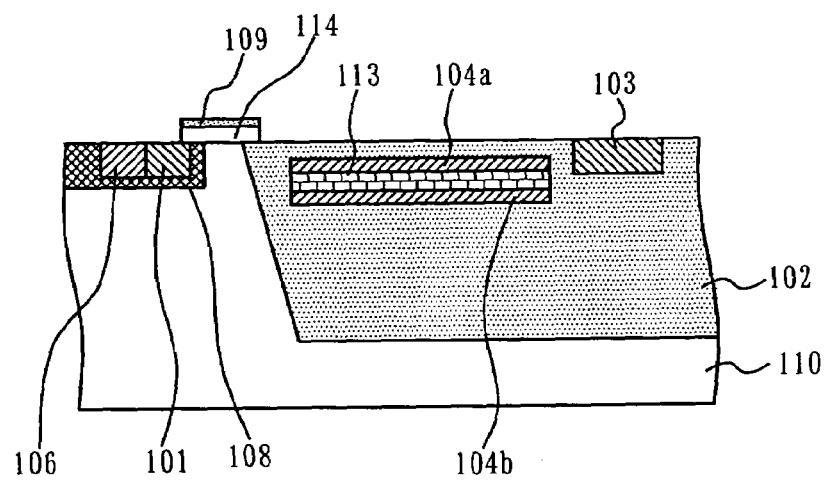
Figure 4C:
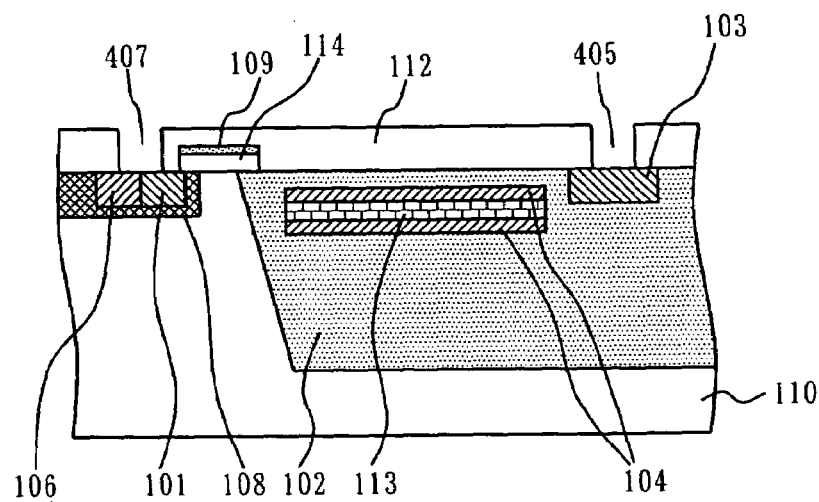

Next, as shown in FIG. 4B, the gate insulating film 114 is formed, and on a surface of the gate insulating film 114, the gate electrode 109 made of polysilicon is formed. Thereafter, arsenic ions are implanted at an energy of about 50 keV to form the N-type high-concentration drain region 103 and the N-type source region 101. In addition, boron ions are implanted at an energy of about 50 keV to form the P-type substrate contact region 106. Thereafter, the insulating film 112 is formed on the entire surface of the P-type semiconductor substrate 110. Thereafter, as shown in FIG. 4C, contact windows 405 and 407 are formed in the insulating film 112. Finally, the drain electrode 105 and the source electrode 107 are formed in the contact windows 405 and 407, respectively. Thus, the semiconductor device 100 of the present invention is completed.

Figure 5:
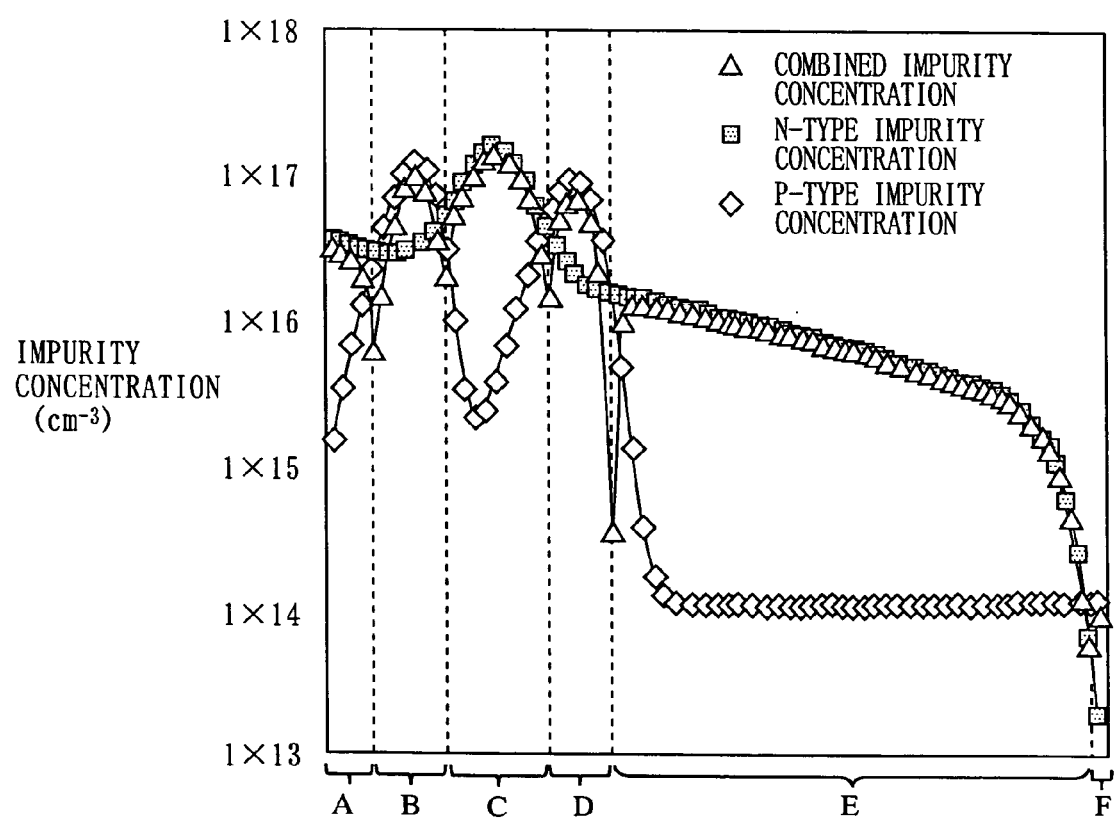
FIG. 5 is a diagram showing an impurity concentration distribution in a G–G' plane of FIG. 1.

FIG. 5 shows the results of simulating concentration distributions of N-type impurity, P-type impurity and combined carriers in a G–G' plane of the semiconductor device 100 of the present invention of FIG. 1. In FIG. 5, the vertical axis represents P-type and N-type impurity concentrations (unit: $cm^{-3}$), while the horizontal axis represents a depth from a surface of the extended drain region 102. In FIG. 5, the N-type impurity concentration, the P-type impurity concentration, and the combined carrier concentration are indicated with square marks, diamond marks, and triangle marks, respectively.

In FIG. 5, a region A indicated under the horizontal axis indicates a region from the surface of the extended drain region 102 to the upper surface of the P-type buried region 104a. A region B indicates a region from the upper layer of the P-type buried region 104a to the lower layer thereof (the upper surface of the N-type buried region 113). A region C indicates a region from the upper surface of the N-type buried region 113 to the lower layer thereof (the upper surface of the P-type buried region 104b) A region D indicates a region from the upper surface to the lower surface of the P-type buried region 104b. A region E indicates a region from the lower surface of the P-type buried region 104b to the bottom surface of the extended drain region 102. Further, a region F indicates a region below the bottom surface of the extended drain region 102.

Figure 6:
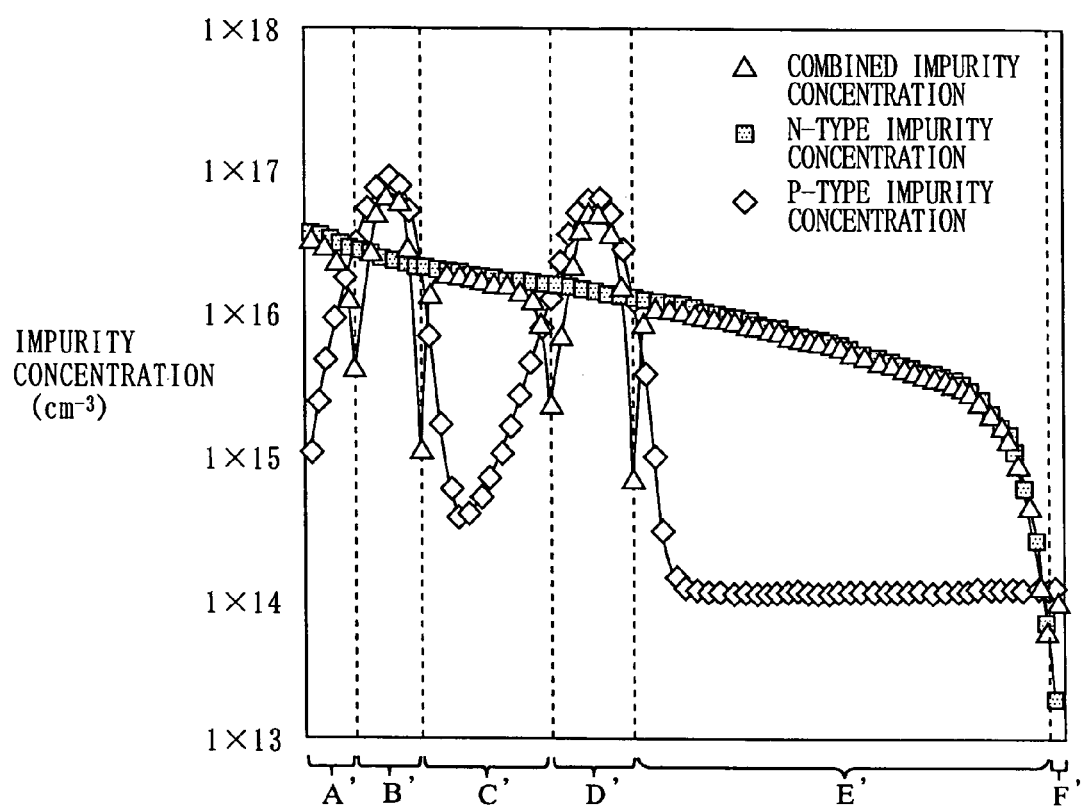
FIG. 6 is a diagram showing an impurity concentration distribution in a G–G' plane of FIG. 1 when no N-type buried region is formed.
Figure 8:
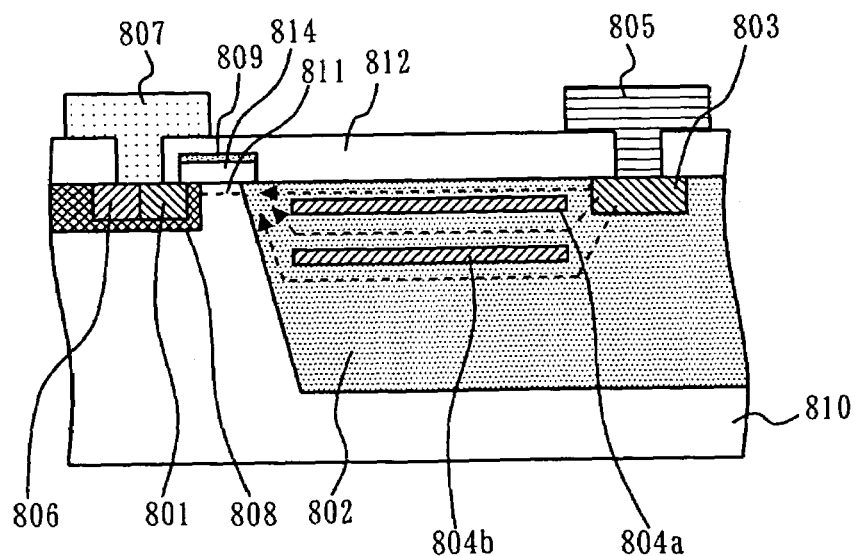
FIG. 8 is a cross-sectional view of a conventional semiconductor device.

FIG. 6 shows the results of simulating concentration distributions of N-type impurity, P-type impurity, and combined carriers when no N-type buried region is formed in the extended drain region 102 as in the semiconductor device 800 of FIG. 8. In FIG. 6, the vertical axis represents P-type and N-type impurity concentration (unit: $cm^{-3}$), while the horizontal axis represents a depth from the surface of the extended drain region 102. In FIG. 6, the N-type impurity concentration, the P-type impurity concentration, and the combined carrier concentration are indicated with square marks, diamond marks, and triangle marks, respectively.

Region A' to F' of FIG. 6 indicated under the horizontal axis correspond to the region A to F of FIG. 5, respectively. It should be noted that the region C' indicates a region from the lower surface of an upper P-type buried region to the upper surface of a lower P-type buried region.

Next, a feature of the semiconductor device 110 of the present invention will be described with reference to FIGS. 5 and 6 by comparing between when the N-type buried region 113 having a characteristic N-type impurity concentration distribution as in the present invention and when no N-type buried region 113 is formed.

As indicated in the region C of FIG. 5, in the semiconductor device 100 of the present invention, the N-type impurity concentration of the N-type buried region 113 increases gradually from the boundary between the regions C and B and the boundary between the regions C and D toward inside of the region C. The concentration is highest around the middle of the region C. In contrast, as shown in FIG. 6, when no N-type high-concentration region is formed, the N-type impurity concentration decreases gradually from the boundary between the region C' and B' to the boundary between the region C' and D'.

The reason will be hereinafter described. The semiconductor device 100 of the present invention has a distribution as described above, whereby the on-resistance can be further reduced while maintaining a high withstand voltage. In the semiconductor device 100 of the present invention, the concentration of the N-type buried region 113 is low in the vicinity of the boundaries between the N-type buried region 113 and the P-type buried regions 104a and 104b. When the N-type impurity concentration of the N-type buried region 113 is low in the vicinity of the boundaries between the N-type buried region 113 and the P-type buried regions 104a and 104b, the extension of a depletion layer occurring from the upper and lower surfaces of the N-type buried region 113 during the off time can be elongated. In order to secure a high withstand voltage, the N-type buried region 113 needs to have a thickness which allows depletion layers occurring from the upper and lower surfaces of the N-type buried region 113 to overlap. When the extension of a depletion layer is long, the thickness of the N-type buried region 113 can be increased. As the thickness of the N-type buried region 113 is increased, the volume of the N-type buried region 113 is increased, so that the amount of N-type impurity contained in the N-type buried region 113 is also increased. The resistance value of the N-type buried region 113 can be reduced by increasing the N-type impurity amount. Thus, the on-resistance of the semiconductor device 100 of the present invention can be reduced.

Although the N-type impurity concentration is low in the vicinity of the boundaries between the regions C and B and between the regions C and D in FIG. 5, extra N-type impurities are implanted into the N-type buried region 113. Therefore, it is higher than the N-type impurity concentration in the vicinity of the boundaries between the regions C' and B' and between the regions C' and D' in FIG. 6. Therefore, unless the width of the region C is narrower than the width of the region C', depletion layers do not overlap. However, in the semiconductor device 100 of the present invention, the N-type impurity concentration of the N-type buried region 113 is high so that the amount of N-type impurity existing in a region between the lower surface of the P-type buried region 104a and the upper surface of the P-type buried region 104b is increased.

As described above, in the semiconductor device 100 of the present invention, the N-type impurity concentration of the N-type buried region 113 is low in the vicinity of the boundary between the N-type buried region 113 and the P-type buried regions 104a and 104b in order to increase the extension of depletion layers. As a result, a large thickness of the N-type buried region can be secured. When the N-type buried region has a large thickness, the thickness of a region having a high N-type impurity concentration in the N-type buried region 113 can be made large. In addition, the highest N-type impurity concentration can be made high, so that a larger amount of N-type impurity can be secured. Therefore, by providing the N-type buried region 113 having an N-type impurity concentration distribution characterized as in the present invention, the on-resistance of the semiconductor device 100 can be reduced while maintaining a high withstand voltage.

In the semiconductor device 100 of the present invention, the same resist pattern 300 is used to form the P-type buried regions 104a and 104b and the N-type buried region 113. Therefore, the P-type buried regions 104a and 104b and the N-type buried region 113 have substantially the same planar shape. By using the same resist pattern 300 to form the P-type buried regions 104a and 104b and the N-type buried region 113, the number of fabrication steps can be reduced, thereby making it possible to suppress time and cost required for fabrication.

Figure 7:
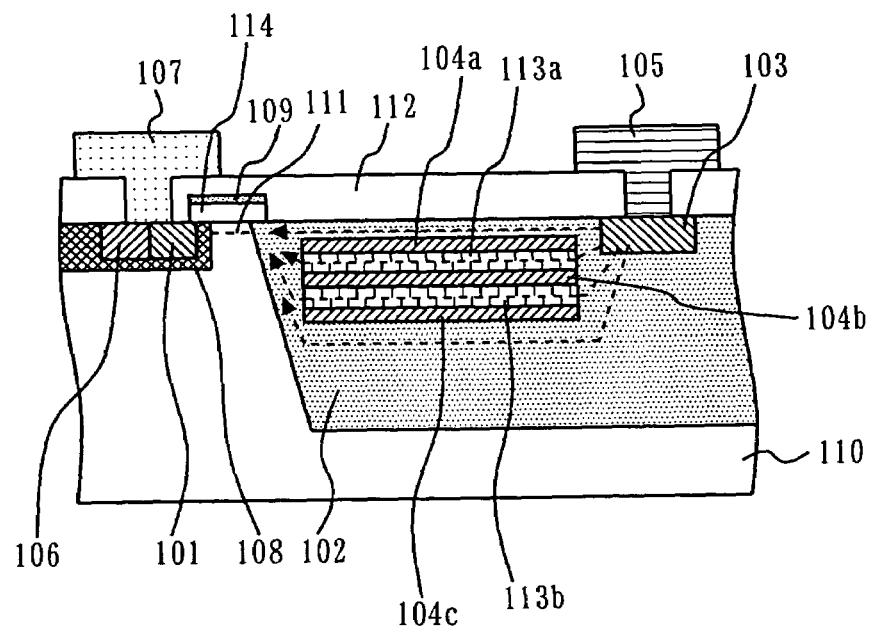
FIG. 7 is a cross-sectional view showing another exemplary semiconductor device according to the present invention.

As described above, an interval of the P-type buried regions 104a and 104b can be narrowed when the N-type buried region 113 is provided, as compared to when the N-type buried region 113 is not provided. Therefore, a space of the extended drain region 102 below the P-type buried region 104b can be increased. When such a space is large, it is easy to provide a larger number of buried region layers in the extended drain region 102. FIG. 7 shows a semiconductor device 100a in which three layers, i.e., P-type buried regions 104a, 104b and 104c, and two layers, i.e., N-type buried regions 113a and 113b, are provided in the extended drain region 102. By increasing the number of N-type buried region layers, the on-resistance can be further reduced.

In addition, by reducing the interval between the P-type buried regions, it is possible to form the lower P-type buried region at a relatively shallow position. When a buried region is formed at a deep position with a high amount of implanted ions, implantation defects occur. Therefore, it is desirable that a buried region can be formed at a shallow position.

It should be noted that the N-type impurity concentration distribution of the N-type buried region 113 is not limited to the distribution shown in the region C of FIG. 5. The N-type impurity concentration of the N-type buried region 113 may be any distribution which has a highest peak in a region other than the boundaries between the N-type buried region 113 and the P-type buried regions 104a and 104b. It is also desirable that a peak of the N-type impurity concentration of the N-type buried region 113 formed at a most shallow position from the surface of the extended drain region 102 is higher than the highest N-type impurity concentration of the extended drain region 102 which is obtained at the surface of the extended drain region 102. It is also desirable that the highest N-type impurity concentration of the N-type buried region 113 is higher than the highest P-type impurity concentration of the P-type buried regions 104a and 104b formed adjacent thereto.

In the above-described embodiments, as described with reference to FIG. 2, the P-type buried regions 104a and 104b and the P-type semiconductor substrate 110 are electrically connected to have the same potential. Alternatively, the P-type buried regions 104a and 104b may electrically float with respect to the P-type semiconductor substrate 110. In this case, the size of a depletion layer is likely to be instable. Therefore, it is desirable that the P-type buried regions 104a and 104b and the P-type semiconductor substrate 110 are electrically connected.

The semiconductor device of the above-described embodiments is an NMOS device in which an N-type drain region and an N-type source region are formed on a P-type semiconductor substrate. The same effect can be obtained in a PMOS device in which a P-type drain region and a P-type source region are formed on an N-type semiconductor substrate. In the case of the PMOS device, the conductivity type of each region formed in the semiconductor substrate may be reversed from the NMOS device, and the distribution of a P-type buried region formed between N-type buried regions may be characterized according to the present invention.

The semiconductor device of the present invention has the above-described structure to achieve both a low on-resistance and a high withstand voltage. Therefore, the semiconductor device of the present invention is useful for applications, such as a power semiconductor device and the like.

While the invention has been described in detail, the foregoing description is in all aspects illustrative and not restrictive. It is understood that numerous other modifications and variations can be devised without departing from the scope of the invention.

What is claimed is:

1. A lateral semiconductor device, comprising:
    a first conductivity type semiconductor substrate;
    a second conductivity type source region formed in the semiconductor substrate;
    a second conductivity type extended drain region formed in the semiconductor substrate;
    a gate electrode formed over the semiconductor substrate between the source region and the extended drain region;
    a drain region formed in the extended drain region and having a second conductivity type impurity concentration higher than that of the extended drain region;
    at least two first conductivity type buried regions formed in the extended drain region at different depths from a surface of the extended drain region; and
    a second conductivity type buried region formed between the first conductivity type buried regions,
    wherein a second conductivity type impurity concentration at an inside of the second conductivity type buried region is higher than a second conductivity type impurity concentration at boundaries between the first conductivity type buried regions and the second conductivity type buried region.

2. The semiconductor device according to claim 1, wherein a highest second conductivity type impurity concentration of the second conductivity type buried region formed at a most shallow position from the surface of the extended drain region is higher than a second conductivity type impurity concentration at the surface of the extended drain region.

3. The semiconductor device according to claim 1, wherein the first conductivity type buried region is formed by ion implantation.

4. The semiconductor device according to claim 1, wherein the second conductivity type buried region is formed by ion implantation.

5. The semiconductor device according to claim 1, wherein the second conductivity type buried region is electrically connected to the semiconductor substrate.

6. The semiconductor device according to claim 1, wherein the first conductivity type buried region and the second conductivity type buried region have substantially the same planar shape.

* * * * *